(12) United States Patent
Shirai

(10) Patent No.: US 6,590,702 B1
(45) Date of Patent: Jul. 8, 2003

(54) MULTILAYER ANTIREFLECTION FILM, OPTICAL MEMBER, AND REDUCTION PROJECTION EXPOSURE APPARATUS

(75) Inventor: Takeshi Shirai, Setagaya-ku (JP)

(73) Assignee: Nikon Corporation, Tokyo (JP)

( * ) Notice: Subject to any disclaimer, the term of this patent is extended or adjusted under 35 U.S.C. 154(b) by 35 days.

(21) Appl. No.: 09/684,517

(22) Filed: Oct. 10, 2000

Related U.S. Application Data

(63) Continuation-in-part of application No. PCT/JP00/01950, filed on Mar. 29, 2000.

(30) Foreign Application Priority Data

Mar. 29, 1999 (JP) .............................. 11-087275

(51) Int. Cl.$^7$ .............................. G02B 5/28; G02B 1/11
(52) U.S. Cl. .................. 359/359; 359/360; 359/580; 359/589
(58) Field of Search .................... 359/350, 352, 359/360, 580, 586, 588, 589, 485, 487, 488

(56) References Cited

U.S. PATENT DOCUMENTS

| | | | | |
|---|---|---|---|---|
| 3,622,225 A | * | 11/1971 | Buchman | |
| 5,339,441 A | * | 8/1994 | Kardos et al. | |
| 5,521,759 A | * | 5/1996 | Dobrowolski et al. | |
| 5,764,416 A | * | 6/1998 | Rahn | |
| 5,770,306 A | * | 6/1998 | Suzuki et al. | |
| 5,925,438 A | * | 7/1999 | Ota et al. | |
| 5,963,365 A | | 10/1999 | Shirai | |

FOREIGN PATENT DOCUMENTS

| | | | |
|---|---|---|---|
| EP | 0855604 | * | 7/1998 |
| JP | 10-253802 | | 6/1987 |
| JP | 62-127701 | | 6/1987 |
| JP | 9-329702 | * | 12/1997 |
| JP | 10-268106 | | 10/1998 |

* cited by examiner

Primary Examiner—Ricky D. Shafer
(74) Attorney, Agent, or Firm—Oliff & Berridge PLC

(57) ABSTRACT

A multilayer antireflection film comprises a laminate consisting of an alternate stack of at least one low-refractive-index layer and at least one high-refractive-index layer, at least one of outermost layers in the laminate is a low-refractive-index layer, and the multilayer antireflection film has the antireflection effect for s-polarized light of a specific wavelength of not more than 250 nm incident to the low-refractive-index layer.

8 Claims, 6 Drawing Sheets

MULTILAYER ANTIREFLECTION FILM, OPTICAL MEMBER, AND REDUCTION PROJECTION EXPOSURE APPARATUS

RELATED APPLICATION

The present application is a continuation-in-part application No. PCT/JP00/01950 filed on Mar. 29, 2000, designating U.S.A and now pending.

BACKGROUND OF THE INVENTION

1. Field of the Invention

The present invention relates to a multilayer antireflection film, an optical member, and a reduction projection exposure apparatus and, more particularly, to a multilayer antireflection film for oblique incidence, which is effective to s-polarized light of the wavelength of not more than 250 nm such as excimer laser light or the like, an optical member provided with the multilayer antireflection film, and a reduction projection exposure apparatus provided with the optical member.

2. Related Background Art

Lasers such as excimer lasers and the like have been developed as light sources of ultraviolet light in recent years and, in conjunction therewith, the lasers have been being used in optical devices making use of the ultraviolet light. For various purposes, the optical members used in optical systems of these devices need to be able to be used with light undergoing oblique incidence and the antireflection film for the optical members must have the antireflection effect against the light undergoing oblique incidence.

The excimer laser light is generally linearly polarized light and whether it is incident as p-polarized light or as s-polarized light to the optical member is dependent upon placement of the optical member in the optical system. Specifically, the incident light is the p-polarized light when it is in such a positional relation that the electric field vector of the wave of incident light vibrates in parallel to the plane of incidence to the optical member, but the s-polarized light when it is in such a positional relation that the electric field vector vibrates normally to the plane of incidence to the optical member.

Japanese Patent Application Laid-Open No. HEI 10-268106 discloses the technology of the multilayer antireflection film for oblique incidence and describes that, where the incident light is the p-polarized light, the antireflection films of 5-layer, 7-layer, and 9-layer structures have the antireflection effect for the p-polarized light incident at angles of incidence θ=70°, 72°, and 74°, respectively. An angle of incidence means an angle between a normal to a surface of a substrate and incident light.

By placing the optical member so that the light incident to the antireflection film formed on the optical member is the p-polarized light as described above, reflection of light can be reduced at the surface of the optical member.

SUMMARY OF THE INVENTION

The conventional antireflection films, however, were those effective only to the p-polarized light and, in order to place the optical members such as lenses, mirrors, prisms, and so on in the optical systems etc. of the, reduction projection exposure apparatus, consideration must be given to such arrangement that the light is incident as the p-polarized light to all the optical members. This decreased degrees of freedom in designing of the apparatus and constituted a restriction on optimization of performance and compactification of the apparatus.

The present invention has been accomplished in view of the issue in the above-stated conventional technology and an object of the present invention is to provide a multilayer antireflection film for oblique incidence that has the excellent antireflection effect for the s-polarized light of the wavelength of not more than 250 nm, such as the excimer laser light or the like, and that is effective in improving the performance such as imaging performance and the like of reduction projection exposure apparatus, an optical member, and a reduction projection exposure apparatus.

The inventors have been conducted intensive and extensive studies in order to achieve the above object and, as a result of the studies, found out that the above issue was solved by a multilayer antireflection film provided with a specific laminate, an optical member provided with the antireflection film, and a reduction projection exposure apparatus provided with the optical member, thus accomplishing the present invention.

Namely, a multilayer antireflection film of the present invention comprises:

a laminate consisting of an alternate stack of at least one low-refractive-index layer and at least one high-refractive-index layer, wherein at least one of outermost layers in the laminate is a low-refractive-index layer, and the multilayer antireflection film having the antireflection effect for s-polarized light of a specific wavelength of not more than 250 nm incident to the low-refractive-index layer.

An optical member of the present invention comprises:

a substrate capable of transmitting s-polarized light of a specific wavelength of not more than 250 nm; and a multilayer antireflection film comprising a laminate placed on the substrate and consisting of an alternate stack of at least one low-refractive-index layer and at least one high-refractive-index layer, wherein at least a layer on the far side from the substrate out of outermost layers in the laminate is a low-refractive-index layer, and the multilayer antireflection film having the antireflection effect for the s-polarized light of the specific wavelength of not more than 250 nm incident to the low-refractive-index layer.

Further, a reduction projection exposure apparatus of the present invention is a reduction projection exposure apparatus comprising:

an exposure light source, a photomask on which a pattern original image is formed, an illumination optical system for illuminating the photomask with light emitted from the light source, a projection optical system for projecting a pattern image emerging from the photomask, onto a photosensitive substrate, and an alignment system for alignment between the photomask and the photosensitive substrate, wherein at least one of optical members constituting the light source, illumination optical system, and projection optical system is an optical member comprising:

a substrate capable of transmitting s-polarized light of a specific wavelength of not more than 250 nm; and a multilayer antireflection film comprising a laminate placed on the substrate and consisting of an alternate stack of at least one low-refractive-index layer and at least one high-refractive-index layer, wherein at least a layer on the far side from the substrate out of outermost layers in the laminate is a low-refractive-index layer, and the multilayer antireflection film having the antireflection effect for the s-polarized light of the specific wavelength of not more than 250 nm incident to the low-refractive-index layer.

According to the present invention, the laminate of the multilayer antireflection film is the alternate stack of at least one low-refractive-index layer and at least one high-refractive-index layer and at least one of the outermost layers is the low-refractive-index layer, whereby the reflectance is reduced where the s-polarized light of the wavelength of not more than 250 nm is obliquely incident to the low-refractive-index layer of the antireflection film. When the reduction projection exposure apparatus is constructed using the optical member provided with the multilayer antireflection film in such arrangement that the outermost layer on the far side from the substrate is the low-refractive-index layer, degrees of freedom in designing of the apparatus increase, so as to allow the optimization of performance and the compactification and it becomes feasible to attain excellent imaging performance, which has never been accomplished by the conventional devices, accordingly.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

Figure 1A:
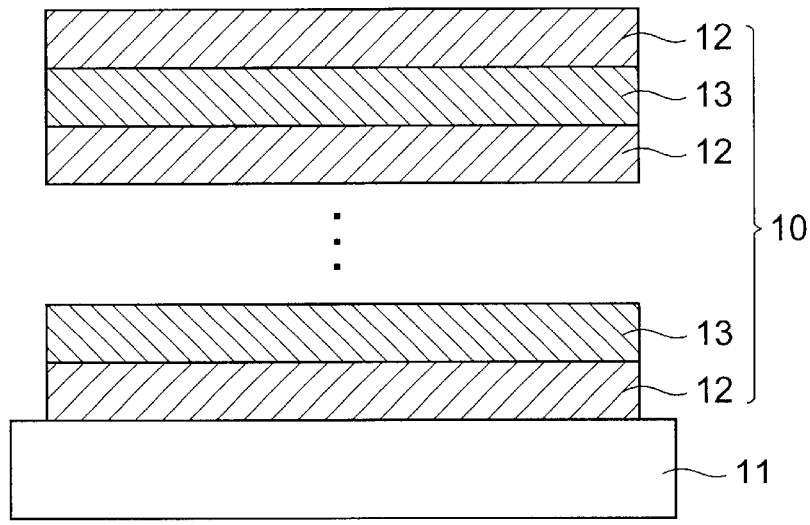
FIG. 1A and FIG. 1B are schematic, cross-sectional views, each showing an example of the multilayer antireflection film of the present invention formed on the substrate, where the total number of low-refractive-index layers and high-refractive-index layers is odd or even, respectively.

The preferred embodiments of the present invention will be described below in detail with reference to the drawings in some cases. In the drawings, like and equivalent portions will be denoted by the same reference symbols.

Figure 1B:
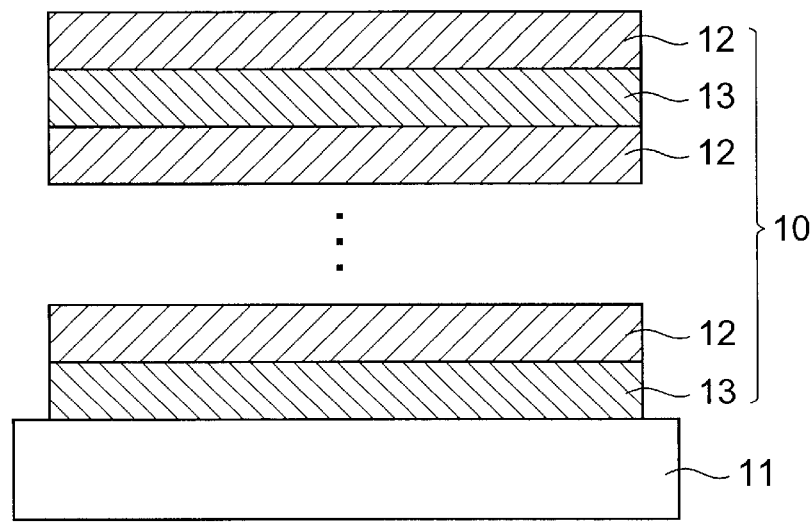

Each of FIG. 1A and FIG. 1B is a schematic, cross-sectional view to show an example of the multilayer antireflection film of the present invention formed on the substrate, wherein FIG. 1A shows an example in which the total number (N) of low-refractive-index layers and high-refractive-index layers composing the antireflection film is odd and FIG. 1B an example in which the total number (N) is even.

The multilayer antireflection film 10 of the present invention is provided with the laminate (alternate layers) consisting of the alternate stack of low-refractive-index layers 12 and high-refractive-index layers 13, on the substrate 11 so that the farthest layer from the substrate 11 is a low-refractive-index layer 12; therefore, a low-refractive-index layer 12 is placed adjacent to the substrate 11 where the number of layers (N) is odd as in FIG. 1A, whereas a high-refractive-index layer 13 adjacent to the substrate 11 where the number of layers (N) is even as in FIG. 1B. Here the low-refractive-index layers are layers having the index of refraction lower than that of the substrate, while the high-refractive-index layers are layers having the index of refraction higher than that of the substrate. The relation expressed by the following equation holds between the number ($N_L$) of the low-refractive-index layers and the number ($N_H$) of the high-refractive-index layers.

$$N_L = \begin{cases} N_H + 1 & \text{(where } N \text{ is an odd number)} \\ N_H & \text{(where } N \text{ is an even number)} \end{cases}$$

The low-refractive-index layers according to the present invention are preferably those containing at least one compound selected from the group consisting of magnesium fluoride, aluminum fluoride, sodium fluoride, lithium fluoride, calcium fluoride, barium fluoride, strontium fluoride, cryolite, chiolite, and silica. In cases where the low-refractive-index layers contain two or more compounds, the form thereof may be either a mixture or a composite. Specifically, for example, where the low-refractive-index layers contain sodium fluoride and aluminum fluoride, they may be of the form of the mixture of sodium fluoride and aluminum fluoride, the form of hexafluoro sodium aluminate ($Na_3AlF_6$), or the like. When the low-refractive-index layers contain either of the above compounds, there is a tendency to demonstrate high transmittance for the ultraviolet light of the specific wavelength of not more than 250 nm. In the present invention, where the antireflection film has a plurality of low-refractive-index layers, materials of the respective layers may be identical or different, but optical thicknesses of the respective low-refractive-index layers ($n_L d_L$), i.e., products of physical thicknesses and refractive indexes of the layers are substantially equal to each other.

The high-refractive-index layers according to the present invention are preferably those containing at least one compound selected from the group consisting of neodymium fluoride, lanthanum fluoride, gadolinium fluoride, dysprosium fluoride; yttrium fluoride, lead fluoride, aluminum oxide, and hafnium oxide. In cases where the high-refractive-index layers contain two or more compounds, the form thereof may be a mixture or a composite. Specifically, for example, where the high-refractive-index layers contain lanthanum fluoride and neodymium fluoride, the form may be a mixture thereof. When the high-refractive-index layers contain either of the above compounds, there is a tendency to demonstrate high transmittance for the ultraviolet light of the specific wavelength of not more than 250 nm. In the present invention, where the antireflection film has a plurality of high-refractive-index layers, materials of the respective layers may be identical or different, but optical thicknesses of the respective high-refractive-index layers ($n_H d_H$), i.e., products of physical thicknesses and refractive indexes of the layers are substantially equal to each other.

When the laminate according to the present invention is an alternate stack of a plurality of low-refractive-index layers 12 having substantially identical optical thicknesses ($n_L d_L$) and a plurality of high-refractive-index layers 13 having substantially identical optical thicknesses ($n_H d_H$) as described above, the laminate has such an optically periodic structure that sums of optical thicknesses of adjacent low-refractive-index layer 12 and high-refractive-index layer 13, i.e., optical cycle lengths (nd) all are substantially equal. Where the refractive indexes of the low-refractive-index layer and the high-refractive-index layer are $n_L$ and $n_H$, respectively, and the physical thicknesses thereof $d_L$ and $d_H$, respectively, the optical cycle length (nd) is expressed by the following equation:

$$nd = n_L d_L + n_H d_H.$$

In the present invention, the optical cycle length (nd) is preferably in the following range:

$$0.6\lambda_0 \leq nd \leq 0.7\lambda_0.$$

If nd is less than the above lower limit there will be a tendency to shift the low-reflection-angle region to the low angle side. If nd is more than the above upper limit there will be a tendency to shift the low-reflection-angle region to the high angle side. In the above equation, $\lambda_0$ represents the designed center wavelength of the light source used, which is not more than 250 nm in the present invention and which is preferably not less than 150 nm and not more than 250 nm. Further, it is preferable in the present invention that the ratio ($\Gamma = n_H d_H / nd$) of the optical thickness ($n_H d_H$) of the high-refractive-index layers to the optical cycle length (nd) be in the following range:

$$0.3 \leq \Gamma \leq 0.75.$$

If $\Gamma$ is off the above region a large number of layers will be needed in order to achieve the antireflection effect and, as a result, there will.be a tendency to increase absorption loss and scattering loss of light in the antireflection film.

The total number (N) of the low-refractive-index layers and high-refractive-index layers in the multilayer antireflection film of the present invention is preferably in the following range:

$$3 \leq N \leq 13.$$

If N is less than the above lower limit there will be a tendency to decrease an angle of limit to attainment of the antireflection effect (to about 45°). If N is over the above upper limit a large number of layers will be needed in order to achieve the antireflection effect and, as a result, there will be a tendency to increase the absorption loss and scattering loss of light in the antireflection film. Particularly preferably, N is in the following range:

$$3 \leq N \leq 7,$$

because it tends to decrease the light absorptance and light scattering rate of the antireflection film and to make production relatively easier.

Further, in the multilayer antireflection film, when the s-polarized light of the wavelength of not more than 250 nm is incident at either one angle of incidence in the range of not less than 65° nor more than 85°, the reflectance is preferably not more than 1.0% and more preferably not more than 0.5%.

Although the multilayer antireflection film of the present invention demonstrates the sufficient antireflection effect for the s-polarized light even in the structure consisting of only the low-refractive-index layers 12 and high-refractive-index layers 13 as illustrated in FIG. 1A and FIG. 1B, it preferably has an absent layer that does not weaken the antireflection effect at the designed center wavelength ($\lambda_0$) of the light source used and at the incident angle of light, i.e., a layer whose optical thickness (nd) is in the following range:

$$0.6\lambda_0 \leq nd < 0.7\lambda_0,$$

as occasion may demand. The above equation defines the relation between the optical thickness (nd) of the absent layer and the designed center wavelength ($\lambda_0$), and this is because the optical thickness (nd) is dependent upon the refractive index of the layer and the incident angle. Where the refractive index of the layer for the light of the wavelength $\lambda$ is $n_\lambda$ and the incident angle of light is $\theta$, the optical thickness (nd) of the layer is given by the following equation:

$$nd = (0.5\lambda_0)/[\cos[\sin^{-1}(\sin(\theta/n_\lambda))]]$$

If such an absent layer is placed as an uppermost layer of the multilayer antireflection film, there will be a tendency to enhance the durability of the multilayer antireflection film (the moisture resistance etc.) without weakening the antireflection effect. In cases where compatibility is inadequate between the low-refractive-index layer and the high-refractive-index layer or between the layer and the substrate, if the absent layer is placed between these, there will be a tendency to prevent deterioration of the interface, delamination of the layer, and so on. Here the absent layer can be positioned either between the low-refractive-index layer 12 and the high-refractive-index layer 13, between the substrate 11 and the layer 12 or 13 in contact with the substrate 11, or on the low-refractive-index layer 12 located farthest from the substrate. A material for the absent layer can be selected from silica ($SiO_2$), magnesium fluoride ($MgF_2$), calcium fluoride ($CaF_2$), barium fluoride ($BaF_2$), strontium fluoride ($SrF_2$), neodymium fluoride ($NdF_3$), lanthanum fluoride ($LaF_3$), gadolinium fluoride ($GdF_3$), dysprosium fluoride ($DyF_3$), yttrium fluoride ($YF_3$), aluminum oxide ($Al_2O_3$), hafnium oxide ($HfO_2$), and so on.

When the multilayer antireflection film of the present invention having the laminate structure as described above is formed on the substrate of the optical member such as a lens, a prism, a plate, or the like by a conventionally known physical deposition method such as vacuum evaporation, sputtering, ion plating, or the like; or chemical deposition method such as CVD, or the like, using the above materials, the optical member can be obtained with the excellent antireflection effect for the s-polarized light of not more than 250 nm.

First Embodiment

The first embodiment of the present invention is the multilayer antireflection film having the laminate structure defined below.

|  |  | optical thickness |
|---|---|---|
| medium | air | — |
| 1st layer | $MgF_2$ | $0.323\lambda_0$ |
| 2nd layer | $LaF_3$ | $0.323\lambda_0$ |
| 3rd layer | $MgF_2$ | $0.323\lambda_0$ |
| 4th layer | $LaF_3$ | $0.323\lambda_0$ |
| 5th layer | $MgF_2$ | $0.323\lambda_0$ |
| substrate | fluorite |  |

In the above first embodiment, the low-refractive-index layers are magnesium fluoride ($MgF_2$) layers and the high-refractive-index layers lanthanum fluoride ($LaF_3$) layers. In this case, the designed center wavelength ($\lambda_0$) is 193 nm and the refractive indexes of air, fluorite, $MgF_2$, and $LaF_3$ are 1.00, 1.50, 1.42, and 1.69, respectively. The optical thicknesses ($n_L d_L$) of the respective low-refractive-index layers ($MgF_2$ layers) are equal and the optical thicknesses ($n_H d_H$) of the respective high-refractive-index layers ($LaF_3$ layers) are equal. Since $n_L d_L = n_H d_H = 0.323\lambda_0$, the optical cycle length (nd) is $0.646\lambda_0$ and the ratio $\Gamma$ of the optical thickness of the high-refractive-index layers to the optical cycle length is 0.500.

Second Embodiment

The second embodiment of the present invention is the multilayer antireflection film having the laminate structure defined below.

|  |  | optical thickness |
|---|---|---|
| medium | air | — |
| 1st layer | $AlF_3$ | $0.427\lambda_0$ |
| 2nd layer | $NdF_3$ | $0.208\lambda_0$ |
| 3rd layer | $AlF_3$ | $0.427\lambda_0$ |
| 4th layer | $NdF_3$ | $0.208\lambda_0$ |
| 5th layer | $AlF_3$ | $0.427\lambda_0$ |
| 6th layer | $NdF_3$ | $0.208\lambda_0$ |
| substrate | silica glass |  |

In the above second embodiment, the low-refractive-index layers are aluminum fluoride ($AlF_3$) layers and the high-refractive-index layers neodymium fluoride ($NdF_3$) layers. In this case, the designed center wavelength ($\lambda_0$) is 193 nm and the refractive indexes of air, silica glass, $AlF_3$, and $NdF_3$ are 1.00, 1.55, 1.39, and 1.72, respectively. The optical thicknesses ($n_L d_L$) of the respective low-refractive-index layers ($AlF_3$ layers) are equal and the optical thicknesses ($n_H d_H$) of the respective high-refractive-index layers ($NdF_3$ layers) are equal. The optical cycle length (nd) is $0.635\lambda_0$ and the ratio $\Gamma$ of the optical thickness of the high-refractive-index layers to the optical cycle length is 0.328.

Third Embodiment

The third embodiment of the present invention is the multilayer antireflection film having the laminate structure defined below.

|  |  | optical thickness |
|---|---|---|
| medium | air | — |
| 1st layer | $SiO_2$ | $0.650\lambda_0$ |
| 2nd layer | $AlF_3$ | $0.427\lambda_0$ |
| 3rd layer | $NdF_3$ | $0.208\lambda_0$ |
| 4th layer | $AlF_3$ | $0.427\lambda_0$ |
| 5th layer | $NdF_3$ | $0.208\lambda_0$ |
| 6th layer | $AlF_3$ | $0.427\lambda_0$ |
| 7th layer | $NdF_3$ | $0.208\lambda_0$ |
| substrate | silica glass |  |

The above third embodiment is the same as the second embodiment except that the silica ($SiO_2$) layer having the optical thickness (nd) of $0.650\lambda_0$ is further placed as an absent layer on the low-refractive-index layer ($AlF_3$ layer) located farthest from the substrate (silica glass).

Fourth Embodiment

The fourth embodiment of the present invention is the multilayer antireflection film having the laminate structure defined below.

|  |  | optical thickness |
|---|---|---|
| medium | air | — |
| 1st layer | $Na_3AlF_6$ | $0.310\lambda_0$ |
| 2nd layer | $LaF_3$ | $0.348\lambda_0$ |
| 3rd layer | $Na_3AlF_6$ | $0.310\lambda_0$ |
| substrate | fluorite |  |

In the above fourth embodiment, the low-refractive-index layers are hexafluoro sodium aluminate ($Na_3AlF_6$) layers and the high-refractive-index layer is a lanthanum fluoride ($LaF_3$) layer. In this case, the designed center wavelength ($\lambda_0$) is 193 nm and the refractive indexes of air, fluorite, $Na_3AlF_6$, and $LaF_3$ are 1.00, 1.50, 1.35, and 1.69, respectively. The optical thicknesses ($n_L d_L$) of the respective low-refractive-index layers ($Na_3AlF_6$ layers) are equal. The optical cycle length (nd) is $0.658\lambda_0$ and the ratio r of the optical thickness of the high-refractive-index layer to the optical cycle length is 0.529.

Fifth Embodiment

The fifth embodiment of the present invention is the multilayer antireflection film having the laminate structure defined below.

|  |  | optical thickness |
|---|---|---|
| medium | air | — |
| 1st layer | $MgF_2$ | $0.280\lambda_0$ |
| 2nd layer | $LaF_3$ | $0.384\lambda_0$ |
| 3rd layer | $MgF_2$ | $0.280\lambda_0$ |
| 4th layer | $LaF_3$ | $0.384\lambda_0$ |
| 5th layer | $MgF_2$ | $0.280\lambda_0$ |
| 6th layer | $LaF_3$ | $0.384\lambda_0$ |
| 7th layer | $MgF_2$ | $0.280\lambda_0$ |
| 8th layer | $LaF_3$ | $0.384\lambda_0$ |
| 9th layer | $MgF_2$ | $0.280\lambda_0$ |
| 10th layer | $LaF_3$ | $0.384\lambda_0$ |
| substrate | fluorite |  |

In the above fifth embodiment, the low-refractive-index layers are magnesium fluoride ($MgF_2$) layers and the highrefractive-index layers are lanthanum fluoride (LaF$_3$) layers. In this case, the designed center wavelength ($\lambda_0$) is 193 nm and the refractive indexes of air, fluorite, MgF$_2$, and LaF$_3$ are 1.00, 1.52, 1.45, and 1.72, respectively. The optical thicknesses ($n_L d_L$) of the respective low-refractive-index layers (MgF$_2$ layers) are equal and the optical thicknesses ($n_H d_H$) of the respective high-refractive-index layers (LaF$_3$ layers) are equal. The optical cycle length (nd) is 0.664$\lambda_0$ and the ratio $\Gamma$ of the optical thickness of the high-refractive-index layers to the optical cycle length is 0.578.

In the above first to fifth embodiments, each group of the low-refractive-index layers and the high-refractive-index layers are made of the identical compound, but it is a matter of course that they can be made of mutually different materials according to such characteristics as the durability, the compatibility between the substrate and the film, and so on. Further, the multilayer antireflection films of the present invention can be applied, not only to the excimer laser light of the wavelength of 193 nm, but also to the ultraviolet light of shorter wavelengths including the F$_2$ laser light of the wavelength of 157 nm and so on.

Sixth Embodiment

Figure 2:
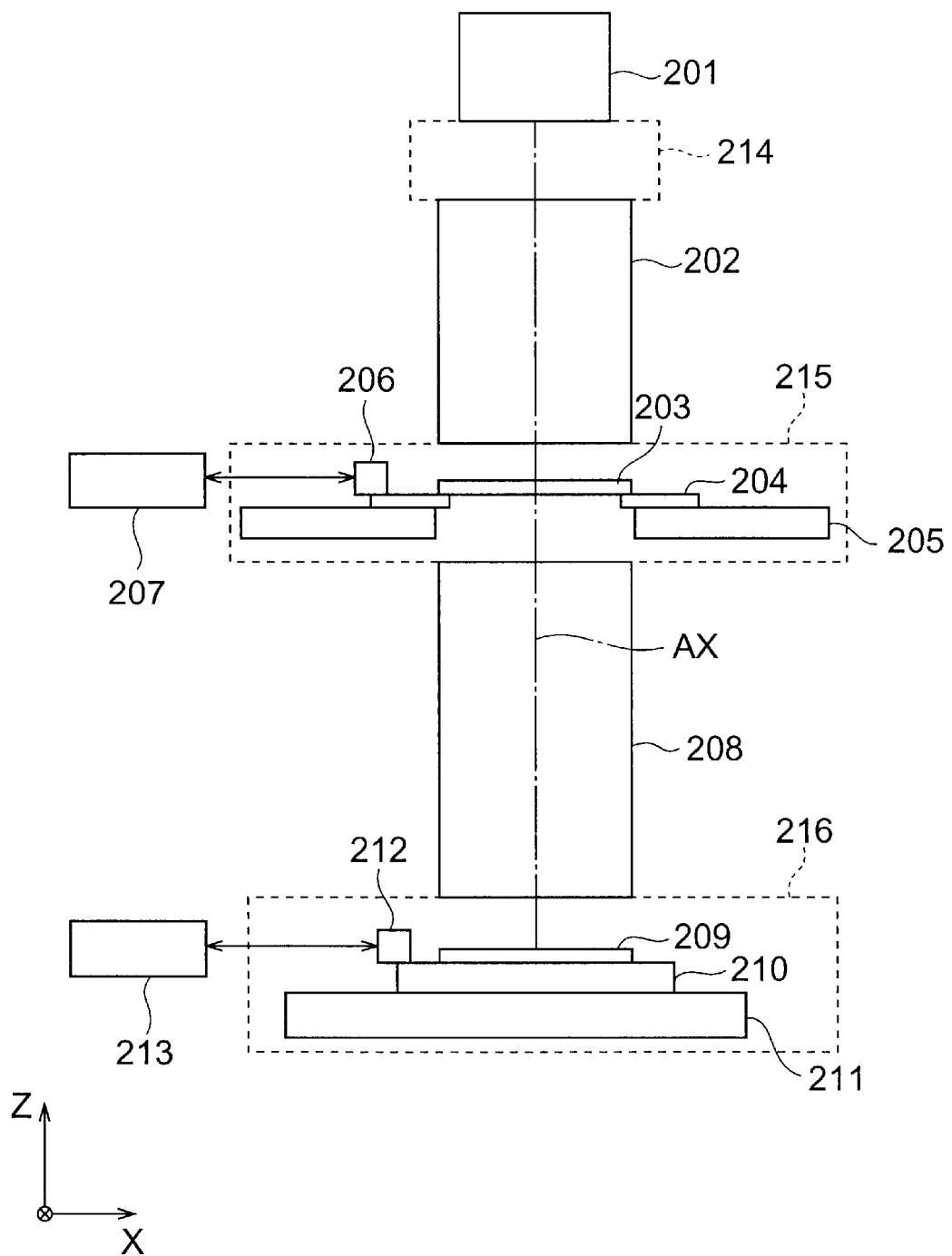
FIG. 2 is a schematic, structural diagram to show an example of the reduction projection exposure apparatus of the present invention.

Next, an example of the preferred embodiment of the reduction projection exposure apparatus according to the present invention is presented in FIG. 2.

FIG. 2 is a schematic diagram to show the overall structure of the reduction projection exposure apparatus provided with cata-dioptric systems. In FIG. 2 the Z-axis is taken in parallel to the optical axis AX of projection optical system 208, the X-axis in parallel to the plane of FIG. 2 in a plane normal to the optical axis AX, and the Y-axis normal to the plane of the drawing.

The reduction projection exposure apparatus of FIG. 2 is provided with a light source 201 for supplying illumination light of the wavelength of not more than 250 nm. The light source 201 has a front mirror (semitransparent) and a rear mirror for resonance, a wavelength selector (a diffraction grating, a prism, an etalon, or the like) for narrowing the wavelength band, a spectroscope for monitoring absolute values of oscillation wavelength, a detector for monitoring laser power, and a shutter, and a mixture gas of a rare gas halide or the like is confined inside the light source 201. The light source 201 of this structure can be selected from the KrF excimer laser (248 nm), the ArF excimer laser (193 nm), the F$_2$ laser (157 nm), and so on.

The light emitted from the light source 201 uniformly illuminates a photomask 203 on which a predetermined pattern is formed, through an illumination optical system 202. A bending mirror or a plurality of bending mirrors for deflection of optical paths are placed in the optical paths from the light source 201 to the illumination optical system 202 as occasion may demand. The illumination optical system 202 has optics including an optical integrator, for example, comprised of a fly's eye lens or an internal reflection type integrator and forming a surface illuminant of predetermined size and shape, a field stop for defining the size and shape of an illumination area on the photomask 203, a field stop imaging optical system for projecting an image of this field stop onto the mask, and so on. Further, the optical paths between the light source 201 and the illumination optical system 202 are hermetically confined in a casing 214 and the gas inside the space from the light source 201 to the optical member closest to the mask in the illumination optical system 202 is replaced with an inert gas with low absorptance for the exposure light.

The photomask 203 is held through a mask holder 204 in parallel to the XY plane on a mask stage 205. A pattern to be transferred is formed on the photomask 203 and the pattern area is illuminated in a rectangular shape (or slit shape) having its longer sides along the Y-direction and shorter sides along the X-direction in the entire pattern area.

The mask stage 205 is two-dimensionally movable along the mask surface (XY plane), coordinates of the position thereof are measured by an interferometer 207 using a mask movement mirror 206, and the position is controlled based thereon.

Light from the pattern formed on the photomask 203 travels through the projection optical system 208 to form a mask pattern image on a wafer 209 being a photosensitive substrate. The wafer 209 is held through a wafer holder 210 in parallel to the XY plane on a wafer stage 211. Then the pattern image is formed in a rectangular exposure area having its longer sides along the Y-direction and shorter sides along the X-direction on the wafer 209 in optical correspondence to the rectangular illumination area on the photomask 203.

The wafer stage 211 is two-dimensionally movable along the wafer surface (XY plane), an interferometer 213 using a wafer movement mirror 212 measures coordinates of the position of the wafer stage, and the position thereof is controlled based thereon.

In the reduction projection exposure apparatus of FIG. 2, the inside of the projection optical system 208 is kept in an airtight condition and the gas inside the projection optical system 208 is replaced with the inert gas.

Further, the photomask 203, the mask stage 205, etc. are placed in the narrow optical paths between the illumination optical system 202 and the projection optical system 208, and the inside of casing 215 hermetically enclosing the photomask 203, the mask stage 205, etc. is filled with the inert gas.

The wafer 209, the wafer stage 211, etc. are placed in the narrow optical path between the projection optical system 208 and the wafer 209, and the inside of the casing 216 hermetically enclosing the wafer 209, the wafer stage 211, etc. is filled with the inert gas such as nitrogen, helium gas, or the like.

In this way the atmosphere absorbing little exposure light is created throughout the entire optical paths from the light source 201 to the wafer 209.

As described above, the field area (illumination area) on the photomask 203 and the projection area (exposure area) on the wafer 209, defined by the projection optical system 208, are of the rectangular shape having the shorter sides along the X-direction. Therefore, while controlling the positions of the photomask 203 and the wafer 209 with driving systems, the interferometers (207, 213), etc., the mask stage 205 and the wafer stage 211 and, as a result, the photomask 203 and the wafer 209 are synchronously moved (scanned) along the shorter-side direction of the rectangular exposure area and illumination area, or along the X-direction whereby scanning exposure of the mask pattern is effected on the region having the width equal to the longer sides of the exposure area on the wafer 209 and the length according to the scanning distance (moving distance) of the wafer 209.

In the present invention, at least one of the optical members constituting the light source, the illumination optical system, and the projection optical system is the optical member of the present invention. Combination use of the optical member of the present invention having the multilayer antireflection film for the s-polarized light with the optical member having the multilayer antireflection film for the p-polarized light is more preferable in terms of the optimization of performance and the compactification of the apparatus.

Figure 3:
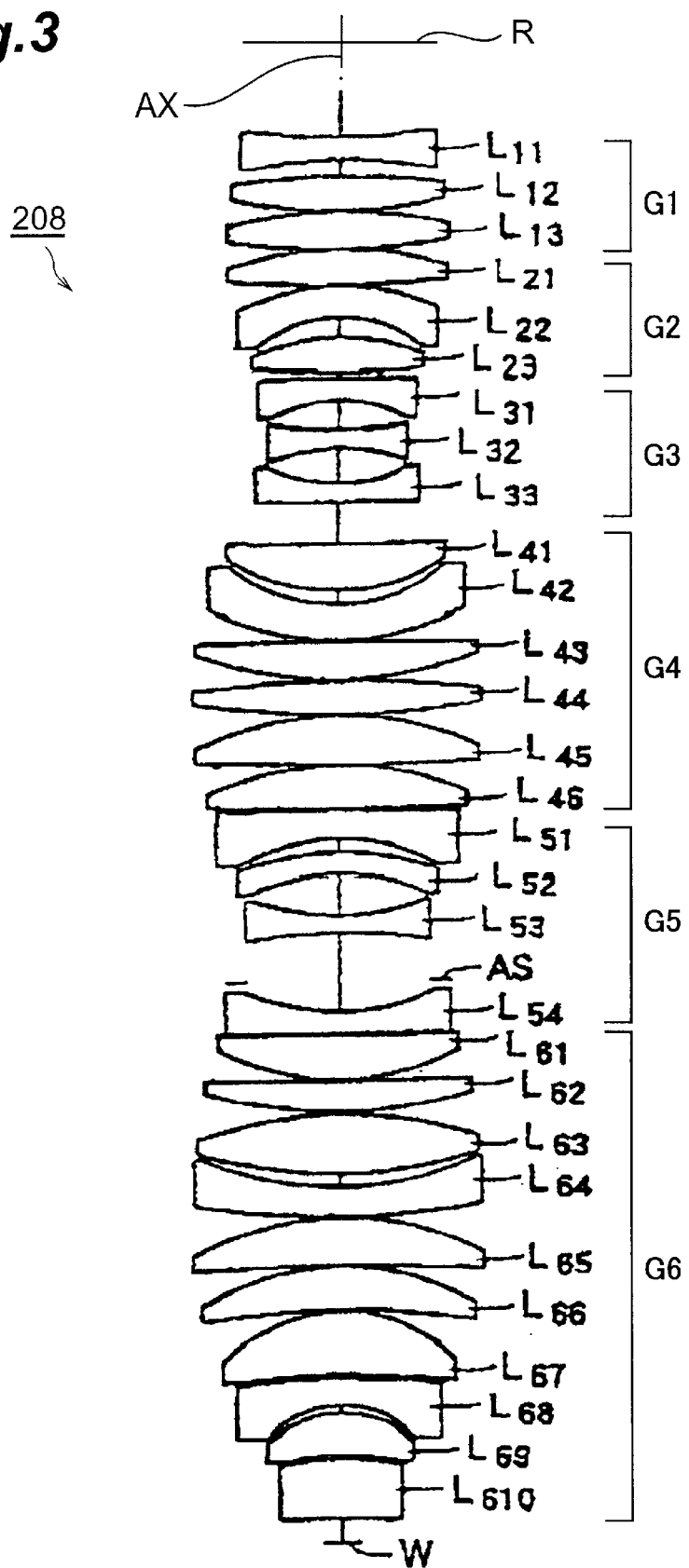
FIG. 3 is a schematic, structural diagram to show an example of the projection optical system using the optical members of the present invention.

FIG. 3 is a schematic diagram to show an example of lens layout of the projection optical system 208 of FIG. 2.

The projection optical system 208 illustrated in FIG. 3 has a first lens unit G1 of a positive power, a second lens unit G2 of a positive power, a third lens unit G3 of a negative power, a fourth lens unit G4 of a positive power, a fifth lens unit G5 of a negative power, and a sixth lens unit G6 of a positive power arranged in the order named from the side of the reticle R as a first object, is almost telecentric on the object side (reticle R side) and on the image side (wafer W side), and has a reduction magnification. This projection optical system has N. A. of 0.6 and the projection magnification of ¼.

In this projection optical system, the lenses at the six positions of L45, L46, L63, L65, L66, and L67 out of the lenses composing the lens units of G1 to G6 are those made of a single crystal of calcium fluoride for the purpose of correction for chromatic aberration, and the lenses other than those at the six positions are of silica glass. It is preferable herein to use the optical member of the present invention for at least one of the lenses composing the lens units of G1 to G6. Further, it is more preferable to use the optical member of the present invention having the multilayer antireflection film for the s-polarized light in combination with the optical member having the antireflection film for the p-polarized light.

When at least one of the optical members constituting the exposure light source, the illumination optical system, and the projection optical system in the reduction projection exposure apparatus is the optical member of the present invention as described above, the reflectance is reduced for the s-polarized light of the wavelength of not more than 250 nm, which achieves the optimization of performance, e.g., improvement in resolution, and which increases degrees of freedom in designing of the apparatus, so as to permit the compactification of the apparatus.

EXAMPLES

The present invention will be described below in further detail, based on examples, but it should be noted that the present invention is by no means intended to be limited to the following examples.

Example 1

$MgF_2$ and $LaF_3$ were alternately deposited over a fluorite substrate by vacuum evaporation to obtain an optical member provided with the multilayer antireflection film having the laminate structure defined below.

|  |  | optical thickness |
|---|---|---|
| medium | air | — |
| 1st layer | $MgF_2$ | $0.323\lambda_0$ |
| 2nd layer | $LaF_3$ | $0.323\lambda_0$ |
| 3rd layer | $MgF_2$ | $0.323\lambda_0$ |
| 4th layer | $LaF_3$ | $0.323\lambda_0$ |
| 5th layer | $MgF_2$ | $0.323\lambda_0$ |
| substrate | fluorite |  |

The deposition conditions were as follows:

pressure: not more than $1\times10^{-4}$ Torr temperature: not less than 100° C.

In the multilayer antireflection film of this optical member, the designed center wavelength ($\lambda_0$) was 193 nm, the optical thickness ($n_L d_L$) of each low-refractive-index layer ($MgF_2$ layer) $0.323\lambda_0$, the optical thickness ($n_H d_H$) of each high-refractive-index layer ($LaF_3$ layer) $0.323\lambda_0$, the optical cycle length (nd) $0.646\lambda_0$, and the ratio $\Gamma$ of the optical thickness of the high-refractive-index layers to the optical cycle length 0.500.

Figure 4:
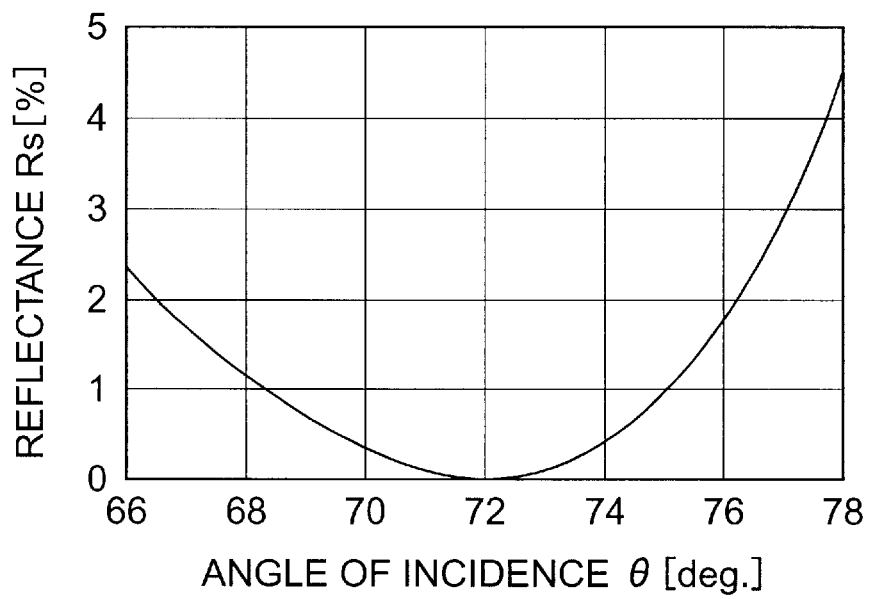
FIG. 4 is a graph to show the relationship between reflectance and angles of incidence for the s-polarized light of the wavelength of 193 nm, which was obtained with the multilayer antireflection film of Example 1.

With the optical member obtained in this way, the reflectance was measured for the s-polarized light of the wavelength of 193 nm undergoing oblique incidence. The relationship between reflectance (Rs) and angles of incidence ($\theta$) of the s-polarized light, obtained by this measurement, is presented in FIG. 4. In FIG. 4, Rs =0 at $\theta=72°$, and it was thus verified that the above multilayer antireflection film had the high antireflection effect for the s-polarized light.

Example 2

An optical member provided with the multilayer antireflection film having the laminate structure defined below was produced in the same manner as in Example 1 except that $AlF_3$ and $NdF_3$ were used as materials of the multilayer antireflection film and the silica glass as the substrate, the number of layers was 6, and the optical thicknesses of the respective layers were as follows.

|  |  | optical thickness |
|---|---|---|
| medium | air | — |
| 1st layer | $AlF_3$ | $0.427\lambda_0$ |
| 2nd layer | $NdF_3$ | $0.208\lambda_0$ |
| 3rd layer | $AlF_3$ | $0.427\lambda_0$ |
| 4th layer | $NdF_3$ | $0.208\lambda_0$ |
| 5th layer | $AlF_3$ | $0.427\lambda_0$ |
| 6th layer | $NdF_3$ | $0.208\lambda_0$ |
| substrate | silica glass |  |

In the multilayer antireflection film of this optical member, the designed center wavelength ($\lambda_0$) was 193 nm, the optical thickness ($n_L d_L$) of each low-refractive-index layer ($AlF_3$ layer) $0.427\lambda_0$, the optical thickness ($n_H d_H$) of each high-refractive-index layer ($NdF_3$ layer) $0.208\lambda_0$, the optical cycle length (nd) $0.635\lambda_0$, and the ratio $\Gamma$ of the optical thickness of the high-refractive-index layers to the optical cycle length 0.328.

Figure 5:
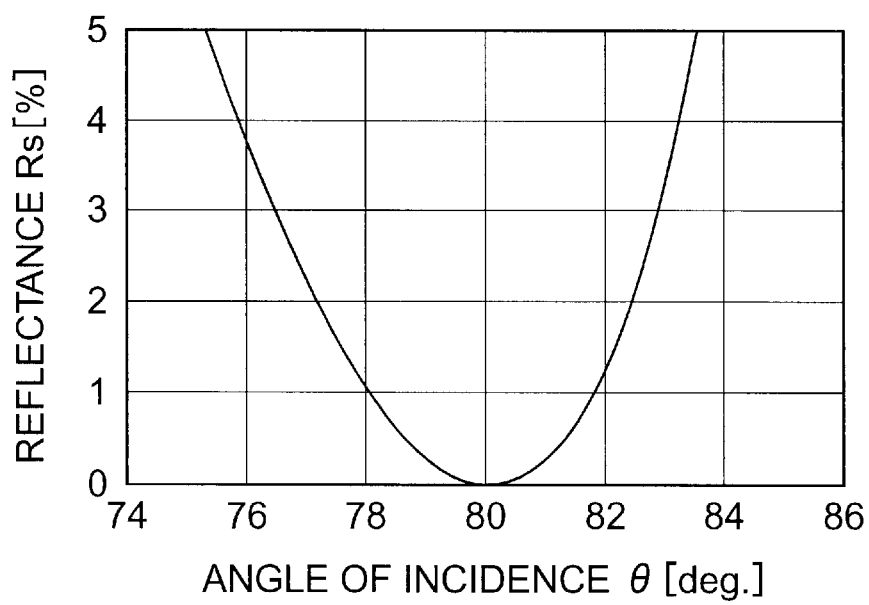
FIG. 5 is a graph to show the relationship between reflectance and angles of incidence for the s-polarized light of the wavelength of 193 nm, which was obtained with the multilayer antireflection film of Example 2.

With the optical member obtained in this way, the reflectance was measured for the s-polarized light of the wavelength of 193 nm in the same manner as in Example 1. The result is presented in FIG. 5. In FIG. 5, Rs is substantially 0% at $\theta=80°$, and it was thus verified that the above multilayer antireflection film had the high antireflection effect for the s-polarized light.

Example 3

An optical member provided with the multilayer antireflection film having the laminate structure defined below was produced in the same manner as in Example 2 except that the absent layer was deposited as the uppermost layer of $SiO_2$.

|  |  | optical thickness |
| --- | --- | --- |
| medium | air | — |
| 1st layer | $SiO_2$ | $0.650\lambda_0$ |
| 2nd layer | $AlF_3$ | $0.427\lambda_0$ |
| 3rd layer | $NdF_3$ | $0.208\lambda_0$ |
| 4th layer | $AlF_3$ | $0.427\lambda_0$ |
| 5th layer | $NdF_3$ | $0.208\lambda_0$ |
| 6th layer | $AlF_3$ | $0.427\lambda_0$ |
| 7th layer | $NdF_3$ | $0.208\lambda_0$ |
| substrate | silica glass |  |

In the multilayer antireflection film of this optical member, the designed center wavelength ($\lambda_0$) was 193 nm, the optical thickness ($n_L d_L$) of each low-refractive-index layer ($AlF_3$ layer) $0.427\lambda_0$, the optical thickness ($n_H d_H$) of each high-refractive-index layer ($NdF_3$ layer) $0.208\lambda_0$, the optical thickness (n'd') of the absent layer ($SiO_2$ layer) $0.650\lambda_0$, the optical cycle length (nd) $0.635\lambda_0$, and the ratio $\Gamma$ of the optical thickness of the high-refractive-index layers to the optical cycle length 0.328.

Figure 6:
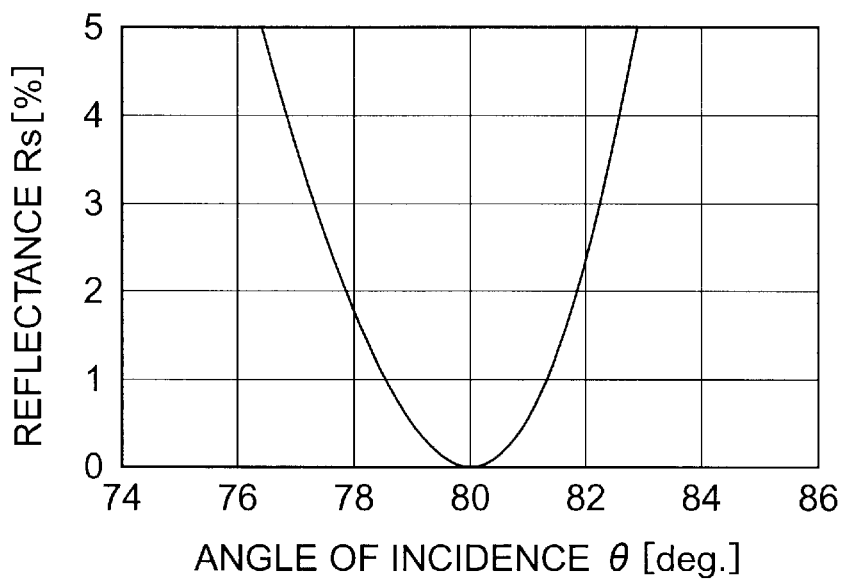
FIG. 6 is a graph to show the relationship between reflectance and angles of incidence for the s-polarized light of the wavelength of 193 nm, which was obtained with the multilayer antireflection film of Example 3.

With the optical member obtained in this way, the reflectance was measured for the s-polarized light of the wavelength of 193 nm in the same manner as in Example 1. The result is presented in FIG. 6. In FIG. 6, Rs is substantially 0% at θ=80°, and it was thus verified that the above multilayer antireflection film had the high antireflection effect for the s-polarized light.

Example 4

An optical member provided with the multilayer antireflection film having the laminate structure defined below was produced in the same manner as in Example 1 except that $Na_3AlF_6$ and $LaF_3$ were used as materials of the multilayer antireflection film, the number of layers was 3, and the optical thicknesses of the respective layers were as follows.

|  |  | optical thickness |
| --- | --- | --- |
| medium | air | — |
| 1st layer | $Na_3AlF_6$ | $0.310\lambda_0$ |
| 2nd layer | $LaF_3$ | $0.348\lambda_0$ |
| 3rd layer | $Na_3AlF_6$ | $0.310\lambda_0$ |
| substrate | fluorite |  |

In the multilayer antireflection film of this optical member, the designed center wavelength ($\lambda_0$) was 193 nm, the optical thickness ($n_L d_L$) of each low-refractive-index layer ($Na_3AlF_6$ layer) $0.310\lambda_0$, the optical thickness ($n_H d_H$) of the high-refractive-index layer ($LaF_3$ layer) $0.348\lambda_0$, the optical cycle length (nd) $0.658\lambda_0$, and the ratio $\Gamma$ of the optical thickness of the high-refractive-index layer to the optical cycle length 0.529.

Figure 7:
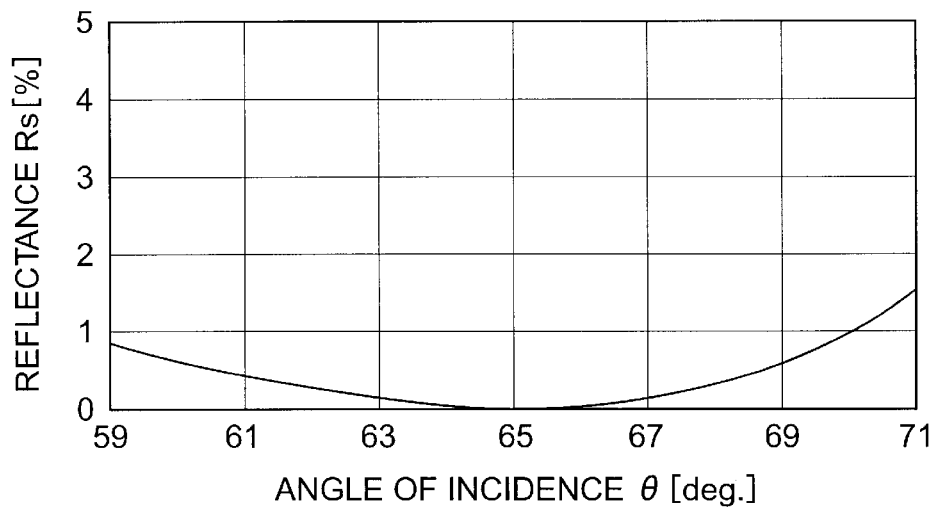
FIG. 7 is a graph to show the relationship between reflectance and angles of incidence for the s-polarized light of the wavelength of 193 nm, which was obtained with the multilayer antireflection film of Example 4.

With the optical member obtained in this way, the reflectance was measured for the s-polarized light of the wavelength of 193 nm in the same manner as in Example 1. The result is presented in FIG. 7. In FIG. 7, Rs is substantially 0% at $\Gamma$=650, and it was thus verified that the above multilayer antireflection film had the high antireflection effect for the s-polarized light.

Example 5

An optical member provided with the multilayer antireflection film having the laminate structure defined below was produced in the same manner as in Example 1 except that the number of layers in the multilayer antireflection film was 10 and the optical thicknesses of the respective layers were as follows.

|  |  | optical thickness |
| --- | --- | --- |
| medium | air | — |
| 1st layer | $MgF_2$ | $0.280\lambda_0$ |
| 2nd layer | $LaF_3$ | $0.384\lambda_0$ |
| 3rd layer | $MgF_2$ | $0.280\lambda_0$ |
| 4th layer | $LaF_3$ | $0.384\lambda_0$ |
| 5th layer | $MgF_2$ | $0.280\lambda_0$ |
| 6th layer | $LaF_3$ | $0.384\lambda_0$ |
| 7th layer | $MgF_2$ | $0.280\lambda_0$ |
| 8th layer | $LaF_3$ | $0.384\lambda_0$ |
| 9th layer | $MgF_2$ | $0.280\lambda_0$ |
| 10th layer | $LaF_3$ | $0.384\lambda_0$ |
| substrate | fluorite |  |

In the multilayer antireflection film of this optical member, the designed center wavelength ($\lambda_0$) was 193 nm, the optical thickness ($n_L d_L$) of each low-refractive-index layer ($MgF_2$ layer) $0.280\lambda_0$, the optical thickness ($n_H d_H$) of each high-refractive-index layer ($LaF_3$ layer) $0.384\lambda_0$, the optical cycle length (nd) $0.664\lambda_0$, and the ratio $\Gamma$ of the optical thickness of the high-refractive-index layers to the optical cycle length 0.578.

Figure 8:
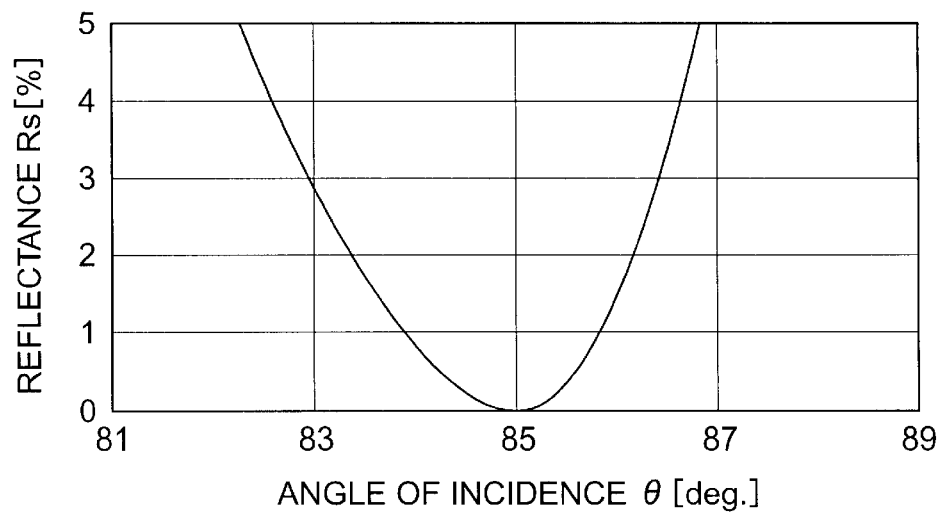
FIG. 8 is a graph to show the relationship between reflectance and angles of incidence for the S-polarized light of the wavelength of 193 nm, which was obtained with the multilayer antireflection film of Example 5.

With the optical member obtained in this way, the reflectance was measured for the s-polarized light of the wavelength of 193 nm in the same manner as in Example 1. The result is presented in FIG. 8. In FIG. 8, Rs is substantially 0% at $\Gamma$=85°, and it was thus verified that the above multilayer antireflection film had the high antireflection effect for the s-polarized light.

As described above, the reflectance is reduced to a sufficient degree for the s-polarized light of the wavelength of not more than 250 nm by depositing the multilayer antireflection film of the present invention on the optical member. Therefore, when the optical member provided with such a multilayer antireflection film is applied to the optical systems of the reduction projection exposure apparatus, degrees of freedom in designing of the apparatus increase in terms of the optimization of performance and the compactification.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A multilayer antireflection film comprising a laminate consisting of an alternate stack of at least one low-refractive-index layer and at least one high-refractive-index layer, the laminate having a first outermost layer on one side of the laminate and a second outermost layer on an opposite side of the laminate, wherein at least one of the first and second outermost layers in the laminate is a low-refractive-index layer, said multilayer antireflection film having the antireflection effect for s-polarized light of a specific wavelength of not more than 250 nm incident to said low-refractive-index layer, wherein the number $N_L$ of said low-refractive-index layer is two or more and wherein the low-refractive-index layers have optical thicknesses substantially equal to each other.

2. The multilayer antireflection film according to claim 1, wherein an optical cycle length nd is in the following range:

$$0.6\lambda_0 \leq nd \leq 0.7\lambda_0$$

where $\lambda_0$ represents a designed center wavelength of the incident s-polarized light, and wherein a ratio $\Gamma = n_H d_H/nd$ of an optical thickness $n_H d_H$ of the high-refractive-index layer to said optical cycle length (nd) is in the following range:

$$0.3 \leq \Gamma \leq 0.75.$$

3. The multilayer antireflection film according to claim 1, wherein the total number N of said low-refractive-index layer and said high-refractive-index layer is in the following range:

$$3 \leq N \leq 13.$$

4. The multilayer antireflection film according to claim 1, wherein the wavelength of said s-polarized light is 193 nm.

5. The multilayer antireflection film according to claim 1, wherein the wavelength of said s-polarized light is 157 nm.

6. A multilayer antireflection film comprising a laminate consisting of an alternate stack of at least one low-refractive-index layer and at least one high-refractive-index layer, the laminate having a first outermost layer on one side of the laminate and a second outermost layer on an opposite side of the laminate, wherein at least one of the first and second outermost layers in the laminate is a low-refractive-index layer, said multilayer antireflection film having the antireflection effect for s-polarized light of a specific wavelength of not more than 250 nm incident to said low-refractive-index layer, wherein the number $N_L$ of said low-refractive-index layer and the number $N_H$ of said high-refractive-index layer each are two or more, the low-refractive-index layers have optical thicknesses substantially equal to each other, and the high-refractive-index layers have optical thicknesses substantially equal to each other.

7. The multilayer antireflection film according to claim 6, wherein an absent layer having an optical thickness (nd) in the following range is placed between said low-refractive-index layer and said high-refractive-index layer in said laminate, or outside the outermost layer of said laminate;

$$0.6\lambda_0 \leq nd \leq 0.7\lambda_0$$

where $\lambda_0$ represents a designed center wavelength of the incident s-polarized light.

8. The multilayer antireflection film according to claim 6, wherein said low-refractive-index layer comprises at least one compound selected from the group consisting of magnesium fluoride, aluminum fluoride, sodium fluoride, lithium fluoride, calcium fluoride, barium fluoride, strontium fluoride, cryolite, chiolite, and silica and wherein said high-refractive-index layer comprises at least one compound selected from the group consisting of neodymium fluoride, lanthanum fluoride, gadolinium fluoride, dysprosium fluoride, yttrium fluoride, lead fluoride, aluminum oxide, and hafnium oxide.

* * * * *